(12) United States Patent
Ikebuchi et al.

(10) Patent No.: US 8,278,694 B2
(45) Date of Patent: Oct. 2, 2012

(54) SEMICONDUCTOR DEVICE WITH VERTICAL TRANSISTOR

(75) Inventors: Yoshinori Ikebuchi, Chuo-ku (JP); Yoshihiro Takaishi, Chuo-ku (JP)

(73) Assignee: Elpida Memory, Inc., Tokyo (JP)

( * ) Notice: Subject to any disclaimer, the term of this patent is extended or adjusted under 35 U.S.C. 154(b) by 0 days.

(21) Appl. No.: 13/026,507

(22) Filed: Feb. 14, 2011

(65) Prior Publication Data
US 2011/0198679 A1 Aug. 18, 2011

(30) Foreign Application Priority Data

Feb. 15, 2010 (JP) .................................. 2010-030586

(51) Int. Cl.
*H01L 29/94* (2006.01)
(52) U.S. Cl. ........ 257/306; 257/302; 257/303; 257/328; 257/335; 257/E29.091
(58) Field of Classification Search .......... 257/328–332, 257/302, 303, 306, 335, E29.091
See application file for complete search history.

(56) References Cited

U.S. PATENT DOCUMENTS
2009/0085102 A1* 4/2009 Takaishi .................. 257/329

FOREIGN PATENT DOCUMENTS
| JP | 8-186123 A | 7/1996 |
| JP | 2004-319808 A | 11/2004 |
| JP | 2008-288391 A | 11/2008 |

* cited by examiner

*Primary Examiner* — Marcos D. Pizarro
*Assistant Examiner* — Eva Yan Montalvo
(74) *Attorney, Agent, or Firm* — Sughrue Mion, PLLC

(57) ABSTRACT

The present invention provides a semiconductor device having a plurality of vertical transistors, which includes, on a substrate, a semiconductor pillar 5; gate electrode 11 provided on the side of the pillar via gate insulating film 10; first diffusion layer 9 connected to the bottom of the pillar; and second diffusion layer 16 connected to the top of the pillar, second diffusion layer 16 includes first portion 14 formed within the area over the pillar, and second portion 15 which is an epitaxial growth layer, formed on the first portion and contacting with insulating film 17 which is provided between adjacent vertical transistors.

16 Claims, 15 Drawing Sheets

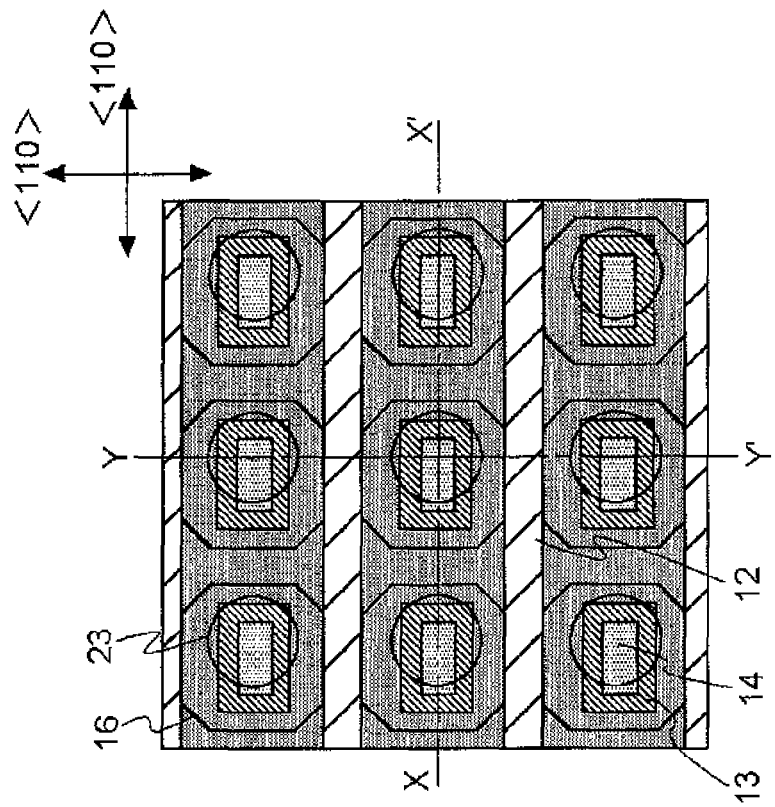
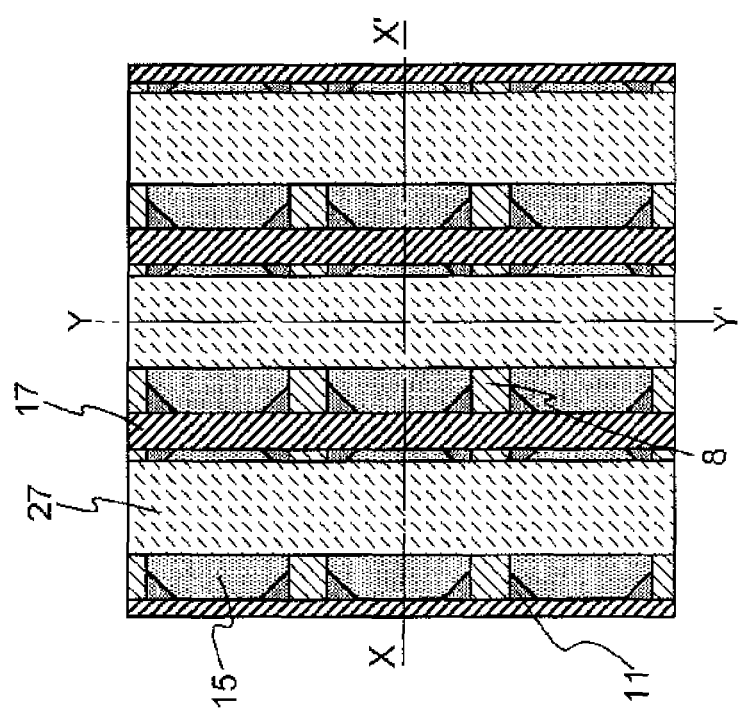
FIG.23B
FIG.23A

SEMICONDUCTOR DEVICE WITH VERTICAL TRANSISTOR

BACKGROUND OF THE INVENTION

1. Field of the Invention

The present invention relates to a semiconductor device with a vertical transistor, and, specifically, relates to a structure of an upper diffusion layer of the vertical transistor.

2. Description of the Related Art

A vertical transistor with a three-dimensional structure was suggested as a transistor for a semiconductor device in an attempt to reduce the size of the chip and to improve the performance. In such a vertical transistor, a gate electrode is provided through a gate insulating film on the side of a pillar-shaped (columnar) semiconductor (hereinafter referred to as "a semiconductor pillar"), which is to be a channel body portion. Furthermore, diffusion layers (upper and lower diffusion layers), which are to be a source and a drain, are formed on the top and bottom of the semiconductor pillar.

A method of forming this vertical transistor is known, in which semiconductor pillars, which are to be a channel body portion, are formed with a semiconductor substrate engraved; a lower diffusion layer is formed by implanting impurity ions, which are the different conductive type from the channel body portion; and a upper diffusion layer is formed on the top of the semiconductor pillar. In this case, a semiconductor layer including the upper diffusion layer was suggested to be made by replacing a mask silicon nitride film, which has been formed for processing the semiconductor pillar, with single crystal silicon by the selective epitaxial growth method (JP-A 2008-288391).

However, the area of the upper diffusion layer in the direction of a substrate plane is usually the same as the area of the top surface of the semiconductor pillar in the direction of the substrate plane. In case that a gate electrode is formed to extend over a mask silicon nitride film, the area of the upper diffusion layer in the direction of the substrate plane is less than the top surface of the semiconductor pillar in the direction of the substrate plane because the upper diffusion layer is formed after an insulating film side wall is formed for insulation. Therefore, when a contact is made with the upper diffusion layer, the misalignment in the pattern between the contact and the upper diffusion layer causes a problem of short circuit with the gate electrode due to the failure of being formed correctly landing on the upper diffusion layer.

In order to resolve the misalignment of the contact, it is generally known to form a contact pad having a larger plane than the bottom surface of the contact. For example, JP-A 2004-319808 discloses that a deposit conductive film, which has a larger area than that of the top surface of the upper diffusion layer, is formed on the upper diffusion layer of a vertical transistor, or that a deposit conductive film connects the upper diffusion layers of two adjacent vertical transistors and the contact is connected to this deposit conductive film.

While the application of a vertical transistor is more focused on the reduction in the chip size, the contact area between the upper diffusion layer of the vertical transistor and the contact pad tends to decrease. Therefore, the reduced size becomes incompatible with the performance of the vertical transistor due to the increased interfacial resistance between the upper diffusion layer and the contact pad.

SUMMARY

The inventors of the present invention accomplish the structure that improves a contact alignment margin without separately forming a contact pad, which causes the problem of the interfacial resistance, by enlarging an upper diffusion layer in the direction of the substrate plane when the upper diffusion layer is formed, by selective epitaxial growth, to be one electrode of a vertical transistor.

Specifically, according to an exemplary embodiment of the present invention, it is provided a semiconductor device including a plurality of vertical transistors, which comprises, on a substrate, a body portion of a pillar-shaped semiconductor;

a gate electrode provided on the side surface of said body portion via a gate insulating film;

a first diffusion layer connected to the bottom of said body portion; and a second diffusion layer connected to the top of said body portion, wherein said second diffusion layer includes a first portion formed within a region projected in the substrate vertical direction of the top surface of said body portion; and a second portion formed on the first portion and extended onto an interlayer insulating film, which is arranged between vertical transistors, outwards the region projected in the substrate vertical direction of the top surface of said body portion, wherein a second insulating film, which is different from the interlayer insulating film, is arranged on said interlayer insulating film between two adjacent vertical transistors, and wherein said second portion is an epitaxial growth layer and is in contact with the side surface of said second insulating film.

According to the present invention, the upper diffusion layer of the vertical transistor includes the first portion having cross sectional dimensions in the substrate plane direction, which is equal to or smaller than the area of the top surface of the body portion, and the second portion formed on the first portion and having cross sectional dimensions in the substrate plane direction, which is equal to or larger than the area of the top surface of the body portion. The second portion is formed by selective epitaxial growth, particularly by isotropic selective epitaxial growth. These structures are self-assembled and formed into a shape similar to a contact pad, and thus increase the contact margin with, for example, a contact being in contact with the structures, thereby preventing short circuit with the gate electrode.

BRIEF DESCRIPTION OF THE DRAWINGS

The above features and advantages of the present invention will be more apparent from the following description of certain preferred embodiments taken in conjunction with the accompanying drawings, in which:

FIG. 1A is a sectional view of FIG. 2 taken along line X-X', and FIG. 1B is a sectional view of FIG. 2 taken along line Y-Y'.

FIG. 22A shows the word line parallel direction of memory cells, and FIG. 22B shows the bit line parallel direction.

FIGS. 23A and 23B are overhead views of FIG. 22: FIG. 23A is a plane view penetrating the interlayer insulating film, and FIG. 23B shows the sectional surface taken line H-H' of FIG. 18.

FIG. 24A shows the word line parallel direction of memory cells, and FIG. 24B shows the bit line parallel direction.

FIG. 25A shows the word line parallel direction of memory cells, and FIG. 25B shows the bit line parallel direction.

FIG. 26A shows the word line parallel direction of memory cells, and FIG. 26B shows the bit line parallel direction.

DETAILED DESCRIPTION OF THE REFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purpose.

Figure 1A:
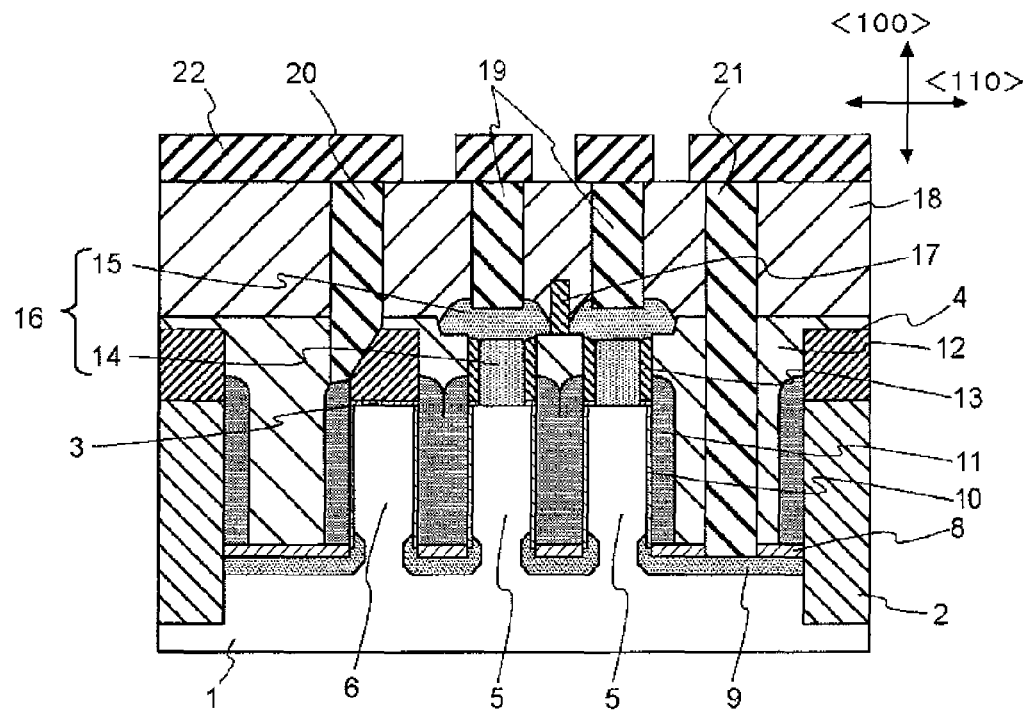
FIGS. 1A and 1B are schematic sectional views of a semiconductor device according to an embodiment of the present invention.
Figure 1B:
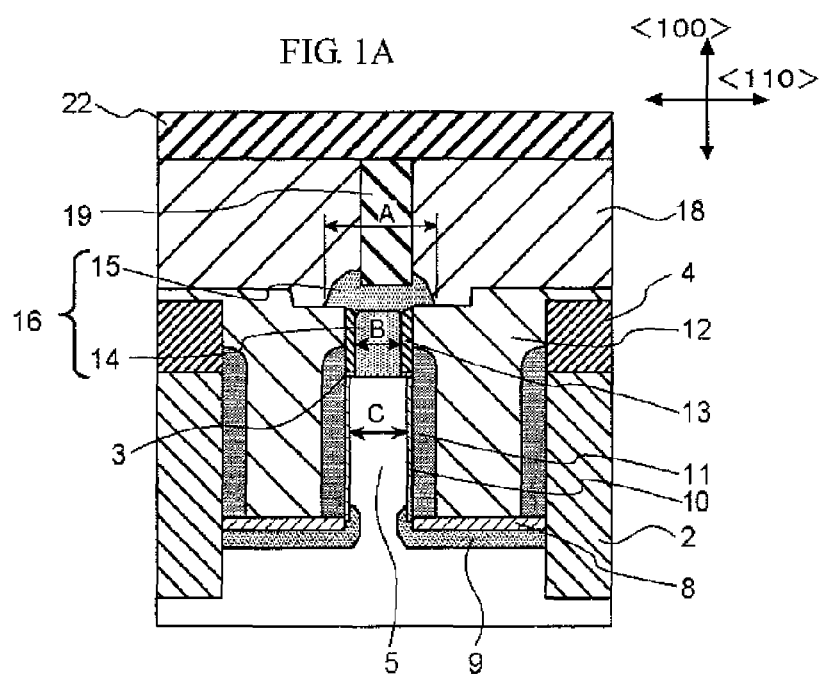
Figure 2:
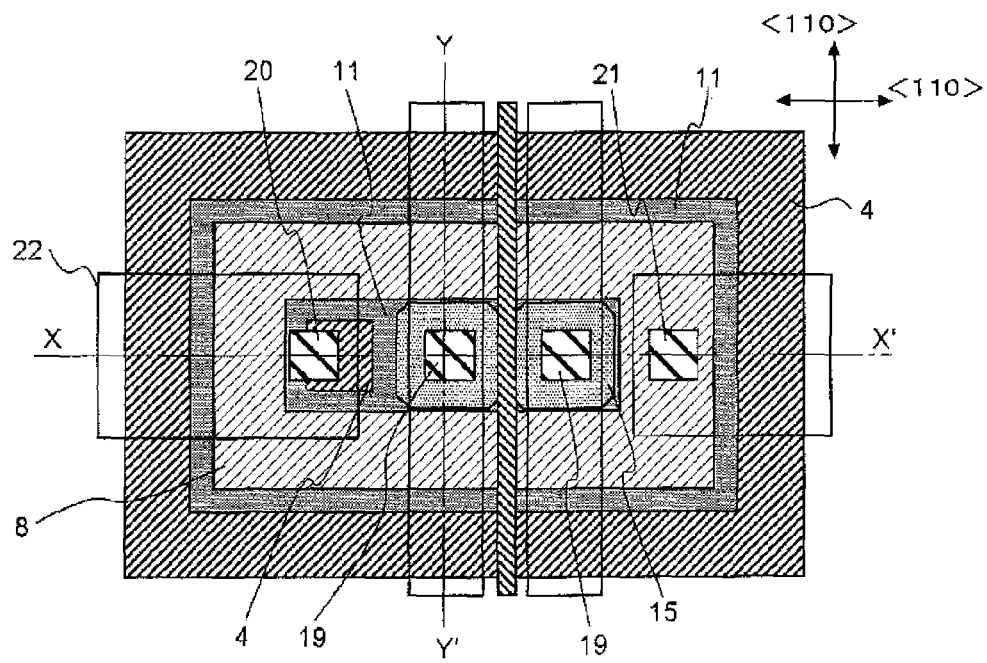
FIG. 2 is a plane view of FIG. 1.

Schematic sectional views of a semiconductor device according to an exemplary embodiment of the present invention are shown in FIG. 1. FIG. 2 is a plane view of FIG. 1, and illustrates an overhead view penetrating first and second interlayer insulating films 12 and 18. FIGS. 1A and 1B are sectional views of FIG. 2 taken along lines X-X' and Y-Y', respectively. Channel silicon pillar 5 is to be a channel body portion of two adjacent vertical transistors. Lower diffusion layer 9 is provided below channel silicon pillar 5 as the first diffusion layer of the vertical transistor, and upper diffusion layer 16 is provided above channel silicon pillar 5 as the second diffusion layer of the vertical transistor. Upper diffusion layer 16 is connected to upper diffusion layer contact 19. As illustrated in FIG. 1B, width B of the bottom portion (first portion 14) of upper diffusion layer 16 is narrower than width C of channel silicon pillar 5, and width A of the upper portion (second portion 15) is wider than width C of channel silicon pillar 5. A second insulating film (hereinafter, upper diffusion layer separating nitride film 17), which is different from first interlayer insulating film 12, is located on first interlayer insulating film 12 arranging between two adjacent vertical transistors. Second portion 15 adjoins the side of upper diffusion layer separating nitride film 17. As such, the misalignment margin between upper diffusion layer 16 and upper diffusion layer contact 19 may be increased without contact between upper diffusion layers 16 of adjacent transistors.

A method of manufacturing the semiconductor device according to the exemplary embodiment is explained.

Figure 3:
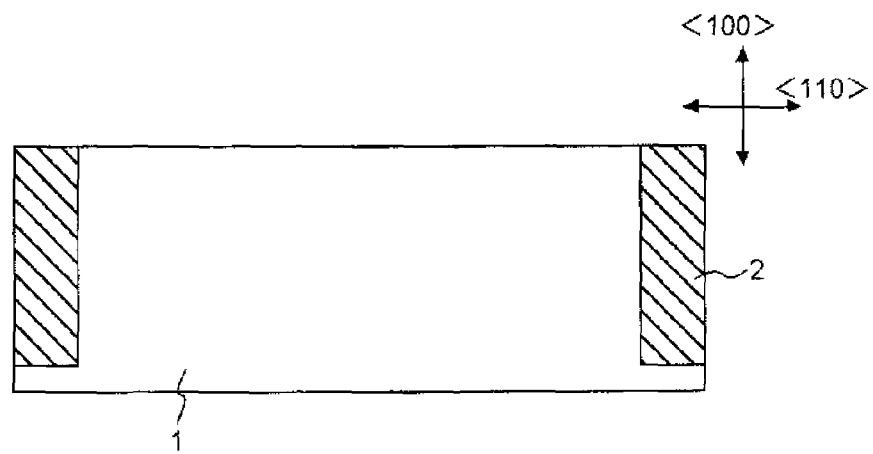
FIG. 3 is a schematic sectional view illustrating a method of manufacturing a semiconductor device according to an embodiment of the present invention, and corresponds to a sectional view of FIG. 2 taken along line X-X'.
Figure 4:
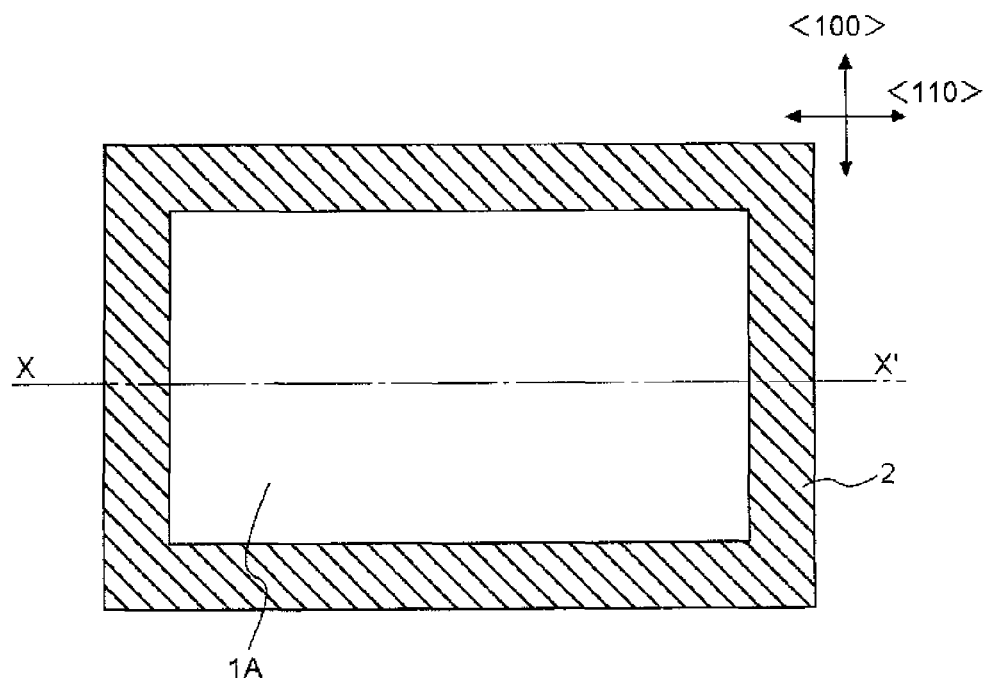
FIG. 4 is a plane view of FIG. 3.

FIG. 3 shows the structure right after active region 1A is set by forming shallow trench isolation (STI) 2. FIG. 4 is a plane view of FIG. 3, which shows a sectional view of FIG. 4 taken along line X-X'.

STI 2 is formed as follows. A trench with the depth of about 220 nm is formed on the main surface of silicon substrate 1 by dry etching. Then, after a thin silicon oxide film (not shown) is formed on the entire surface of the substrate including the inner wall of the trench by thermal oxidation at about 1000° C., a silicon oxide film is deposited on the entire surface of the substrate including the inside of the trench with the thickness of 400 to 500 nm by the high density plasma (HDP) method. Then, STI 2 is formed by removing the unnecessary silicon oxide film on silicon substrate 1 by the chemical mechanical polishing (CMP) method, and by leaving the silicon oxide film only inside the trench.

Figure 5:
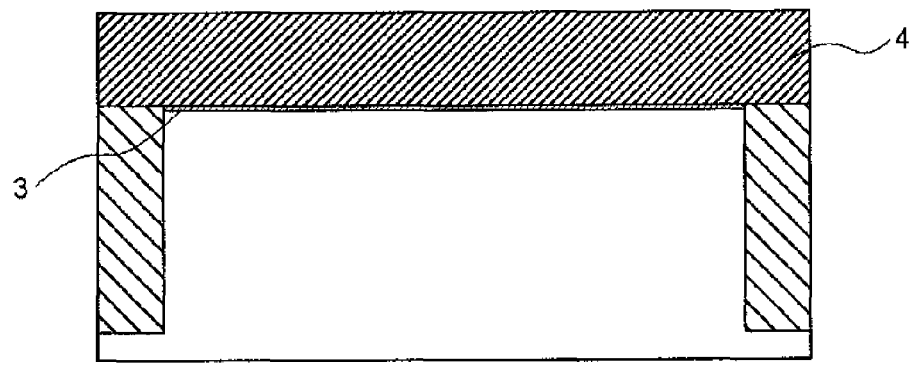
FIGS. 5 and 6 are schematic sectional views illustrating a method of manufacturing a semiconductor device according to an embodiment of the present invention, and corresponds to a sectional view of FIG. 2 taken along line X-X'.

Next, as illustrated in FIG. 5, two channel silicon pillars 5 and gate electrode feed silicon pillar 6 are formed on active region 1A. As shown in FIG. 5, oxide film 3 is formed on the entire surface of silicon substrate 1 as a protective insulating film, and mask nitride film 4 is formed on oxide film 3. Oxide film 3 may be formed by thermal oxidation, and mask nitride film 4 may be formed by the chemical vapor deposition (CVD) method. For example, oxide film 3 may have the thickness of about 5 nm, and mask nitride film 4 may be about 120 nm.

Figure 6:
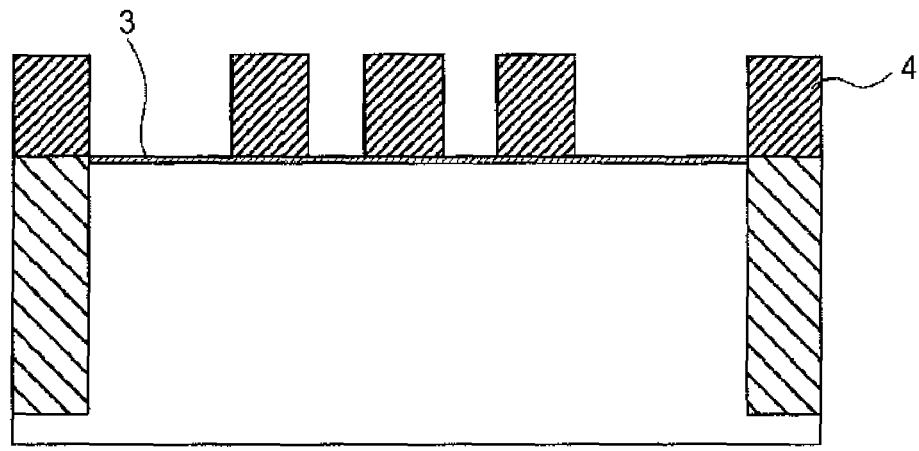
Figure 7:
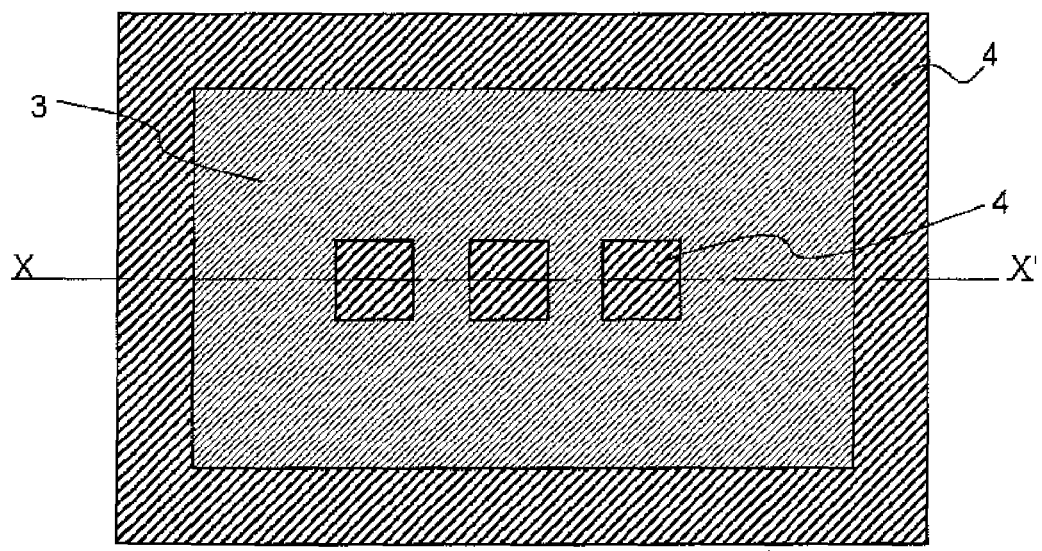
FIG. 7 is a plane view of FIG. 6.

Afterwards, as illustrated in FIG. 6, a mask pattern, which includes sub-mask patterns corresponding, respectively, to each of the locations where channel silicon pillars 5 and gate electrode feed silicon pillar 6 are formed, is formed by patterning mask nitride film 4. FIG. 7 is a plane view of FIG. 6, which is a sectional view of FIG. 7 taken along line X-X'. In this embodiment, mask nitride film 4 is patterned to remain on STI 2 as well.

Figure 8:
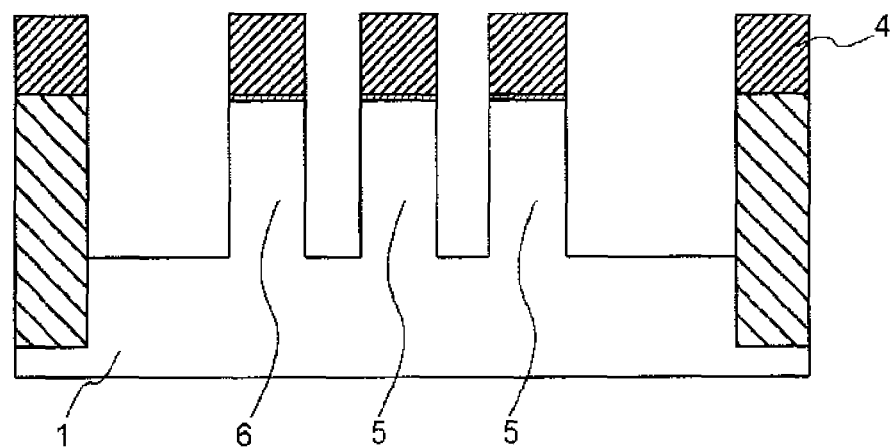
FIGS. 8 to 14 are schematic sectional views illustrating a method of manufacturing a semiconductor device according to an embodiment of the present invention, and corresponds to a sectional view of FIG. 2 taken along line X-X'.

Then, as illustrated in FIG. 8, the exposed surface of active region 1A is dug down by dry etching with the patterned mask pattern. This etching process forms two channel silicon pillars 5 and gate electrode feed silicon pillar 6, all of which are substantially vertical to the main surface of silicon substrate 1. Moreover, the remains of mask nitride film 4 become cap insulating films covering the upper surfaces of the silicon pillars.

Figure 9:
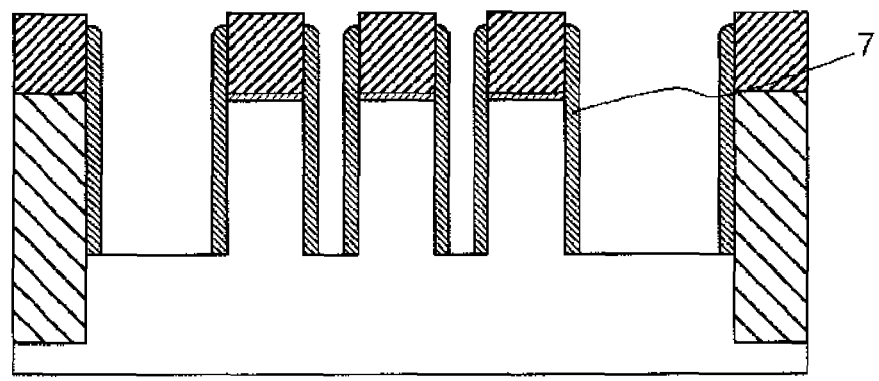

After that, as illustrated in FIG. 9, side wall nitride films 7 are formed on the side surfaces of the silicon pillars. After the exposed surface of silicon substrate 1 is protected by thermal oxidation with mask nitride film 4 left, side wall nitride films 7 are formed by forming a silicon nitride film on the entire surface of the substrate, and then by etching back that silicon nitride film.

Figure 10:
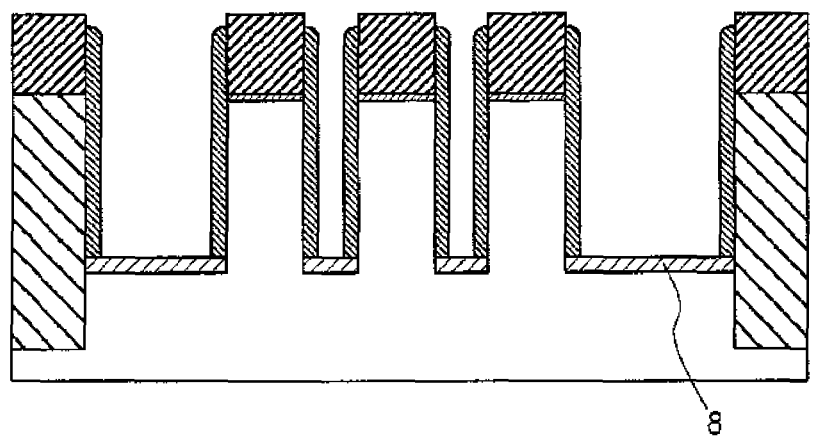

Then, as illustrated in FIG. 10, oxide film 8 is formed on the exposed surface of silicon substrate 1 by thermal oxidation. The top and side surfaces of each of silicon pillars 5 and 6 are not thermally oxidized thanks to the protection by mask nitride film 4 and side wall nitride films 7, respectively. Oxide film 8 preferably has the thickness of about 30 nm.

Figure 11:
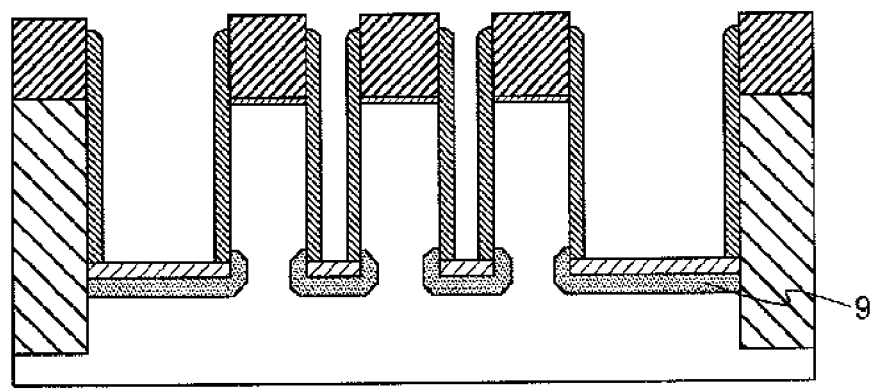

Next, as illustrated in FIG. 11, lower diffusion layer 9 is formed below each of silicon pillars 5 and 6. Lower diffusion layer 9 is formed by ion-implantation, through oxide film 8, of impurities having a conductive type opposite to that of impurities contained in silicon substrate 1. For example, when the silicon substrate is implanted with boron (P type), the lower diffusion layer is formed as N-type by implanting phosphorus or arsenic.

Figure 12:
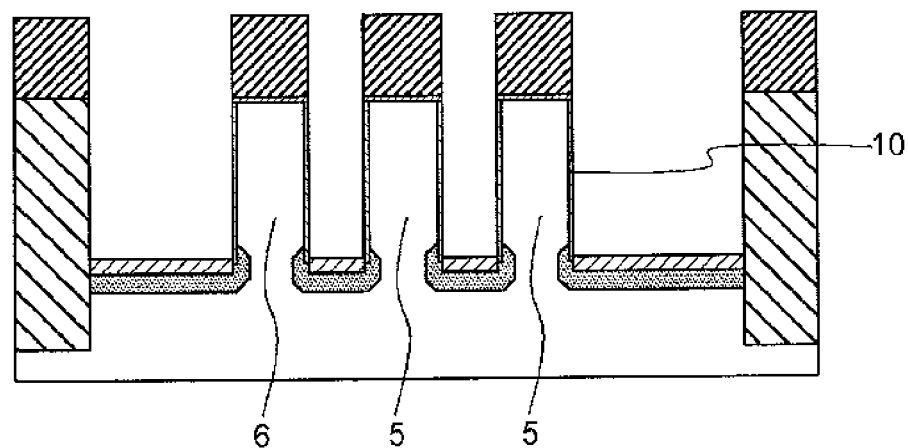

Then, as illustrated in FIG. 12, after side wall nitride films 7 are removed by wet etching with pyrophosphate, gate insulating films 10 are formed on the side surfaces of silicon pillars 5 and 6. Gate insulating films 10 may be formed by thermal oxidation, and may have the thickness of about 5 nm, for example.

Figure 13:
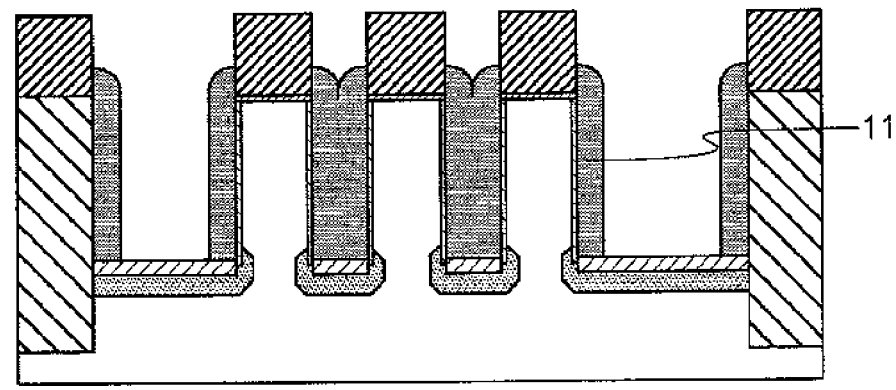

After that, as illustrated in FIG. 13, gate electrode 11 is formed and made of polysilicon film. The polysilicon film is formed on the entire surface of the substrate with the thickness of about 30 nm by the CVD method, and, then, gate electrode is formed by etching back the polysilicon film. As a result, each side of silicon pillars 5 and 6 is covered by gate electrode 11. Moreover, because the distance between two silicon pillars 5, or between silicon pillars 5 and 6, is designed less than the thickness of gate electrode 11, gate electrodes 11 formed on the sides of silicon pillars 5 and 6 are in contact, and are integrally formed, between silicon pillars 5 and 6.

Figure 14:
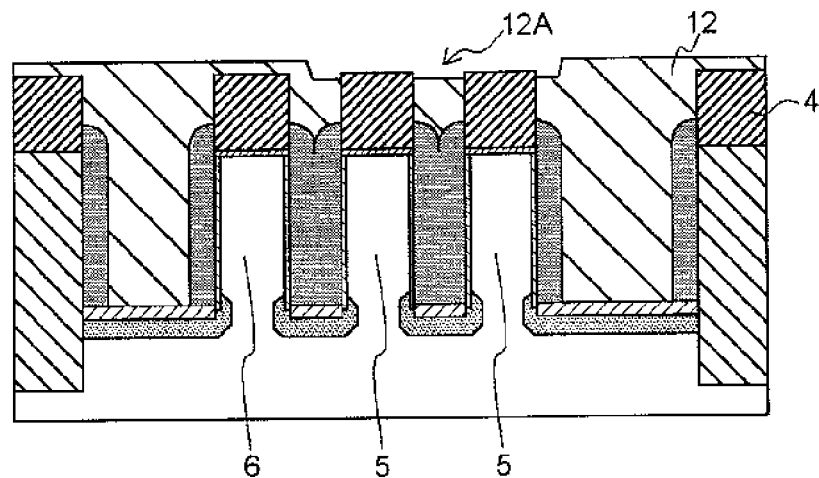
Figure 15:
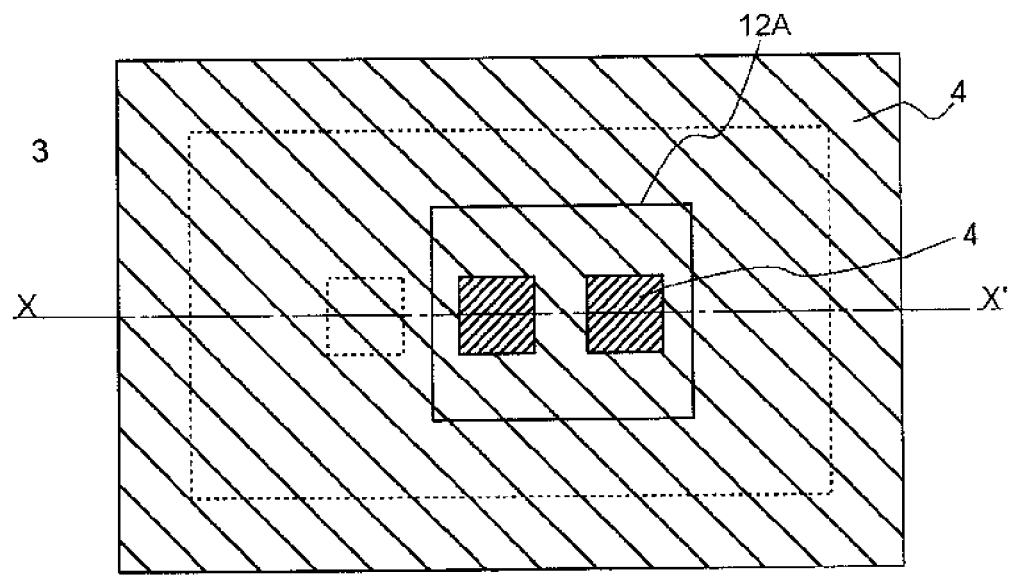
FIG. 15 is a plane view of FIG. 14.

Then, as illustrated in FIG. 14, the entire surface of silicon substrate 1 is buried with first interlayer oxide film 12, and, then, opening 12A are formed to expose only mask nitride films 4 on channel silicon pillars 5. First interlayer oxide film 12 is deposited by the method below. The entire surface of the substrate is first buried with an oxide film by the HDP method, and the oxide film is planarized by CMP with mask nitride film 4 as a stopper. Another oxide film is, then, formed on the entire surface of the silicon substrate with the thickness of about 20 nm, and, finally, patterning and dry etching form opening 12A and expose mask nitride film 4 only on channel pillar silicon 5. FIG. 15 is a plane view after opening 12A is formed, and FIG. 14 is a sectional view of FIG. 15 taken along line X-X'.

Figure 16:
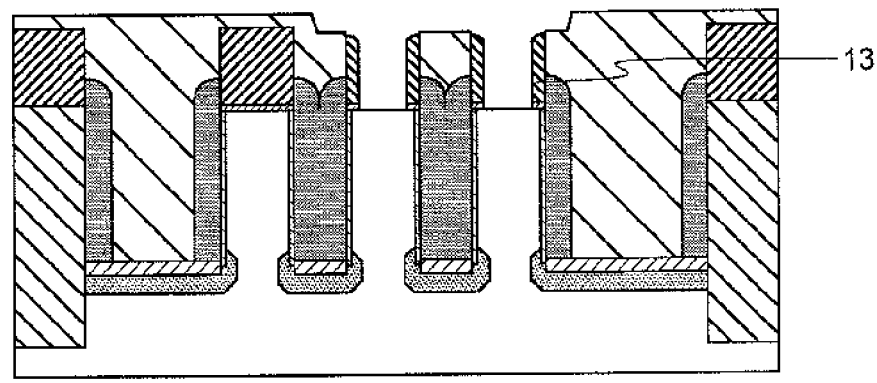
FIGS. 16 to 20 are schematic sectional views illustrating a method of manufacturing a semiconductor device according to an embodiment of the present invention, and corresponds to a sectional view of FIG. 2 taken along line X-X'.

After that, as illustrated in FIG. 16, side wall nitride film 13 is formed in the opening formed after mask nitride film 4 is removed on channel pillar silicon 5. The removal of mask nitride film 4 is performed by wet etching with pyrophosphate. Side wall nitride film 13 is formed by etch-back after a nitride film is formed on the entire surface by the LP (Low Pressure)-CVD method. It is preferable that side wall nitride film 13 has the thickness of about 10 nm. At the same time, oxide film 3 on channel pillar silicon 5 is also removed by etch-back. Further, the upper end of side wall nitride film 13 is flush with the bottom surface with opening 12A.

Figure 17:
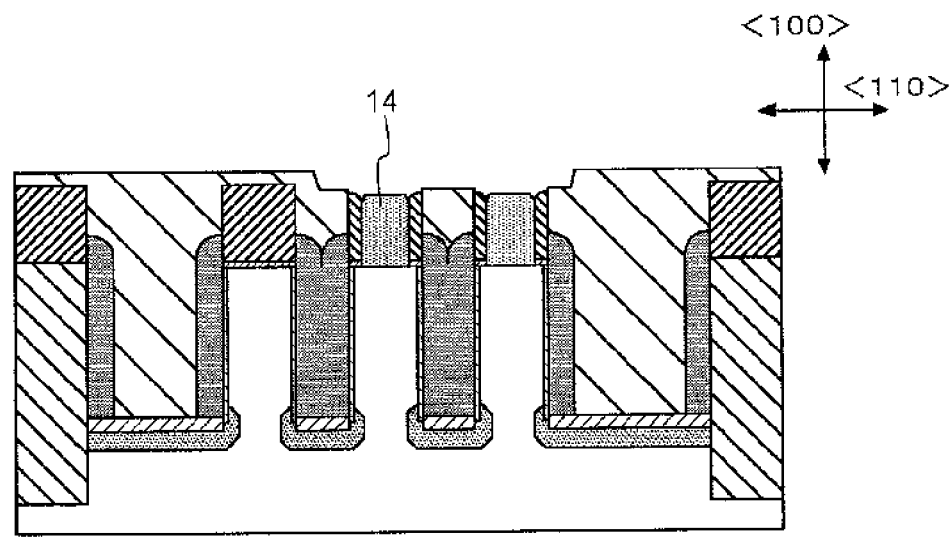

Then, first portion 14 of the upper diffusion layer is formed as illustrated in FIG. 17. First portion 14 of the upper diffusion layer may be formed by the anisotropic selective epitaxial growth method. The anisotropic selective epitaxial growth is performed, with a UHV (Ultra High Vacuum)-CVD apparatus, by introducing, for example, disilane with the flow rate of 2 sccm, and a doping gas (a mixed gas diluting 1% phosphine in hydrogen) with the flow rate of 0.2 sccm, at the temperature of 630° C. under the pressure of $1 \times 10^{-2}$ Pa. The anisotropic selective epitaxial growth is used to earn the growth speed. The growth in <110> direction of {110} plane of silicon substrate 1 does not substantially progress, compared to the growth in <100> direction of {100} plane of silicon substrate 1. The growth in <100> direction of {100} plane of first portion 14 of the upper diffusion layer is preferably by the height of the top surface of side wall nitride film 13.

Figure 18:
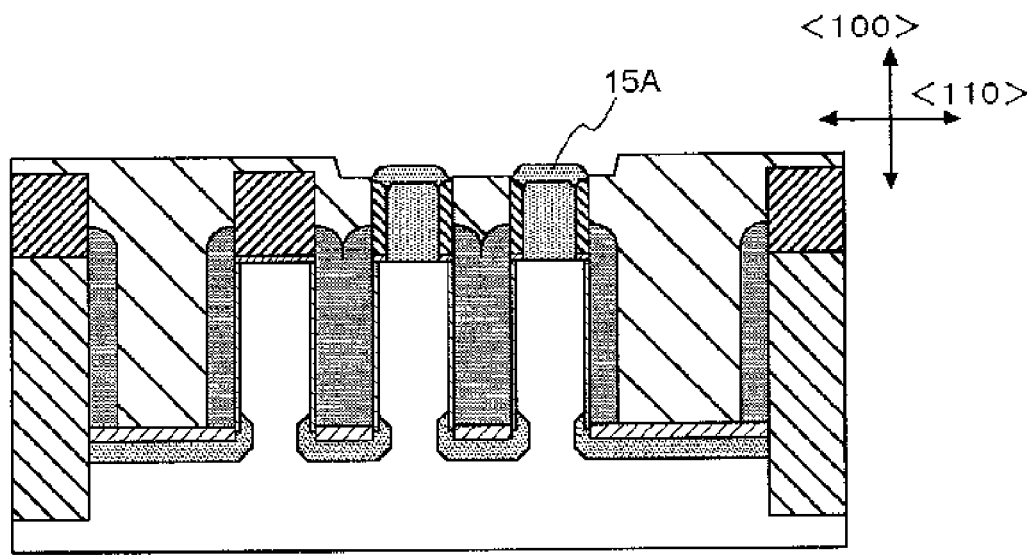

Next, isotropic selective epitaxial layer 15A is formed as illustrated in FIG. 18, and is to be a part of second portion 15 of the upper diffusion layer. The isotropic selective epitaxial growth is performed, with a UHV-CVD apparatus, by introducing, for example, disilane with the flow rate of 6 sccm, and a doping gas (a mixed gas diluting 1% phosphine in hydrogen) with the flow rate of 0.6 sccm, at the temperature of 580° C. under the pressure of $3 \times 10^{-2}$ Pa. In the isotropic selective epitaxial growth, the growth of {100} plane of silicon substrate 1 in <100> direction is identical to that of {110} plane of silicon substrate 1 in <110> direction. However, the growth here is slower than the anisotropic selective epitaxial growth stated above. Here, the growth amount of isotropic selective epitaxial growth layer 15A is so designed that the growth amount of {110} plane in <110> direction is identical to thickness D of side wall nitride film 13. The conductive type of the upper diffusion layer in the first and second portions is identical to that of lower diffusion layer 9. This is because lower diffusion layer 9 and upper diffusion layer 16 (first and second portions 14 and 15) become a source electrode and a drain electrode of a transistor.

Figure 19:
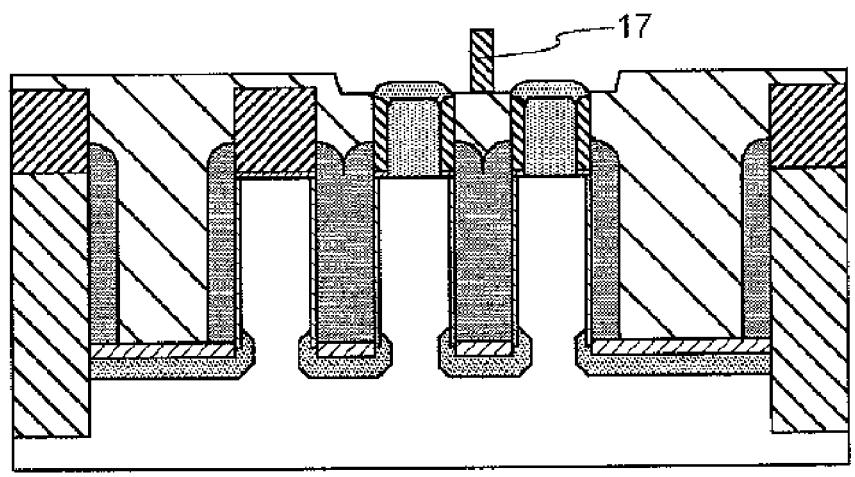

After that, upper diffusion layer separating nitride film 17 is formed as illustrated in FIG. 19. It is formed by plasma nitride film growth and patterning. This upper diffusion layer separating nitride film 17 prevents short circuit between adjacent patterns of isotropic epitaxial growth.

Figure 20:
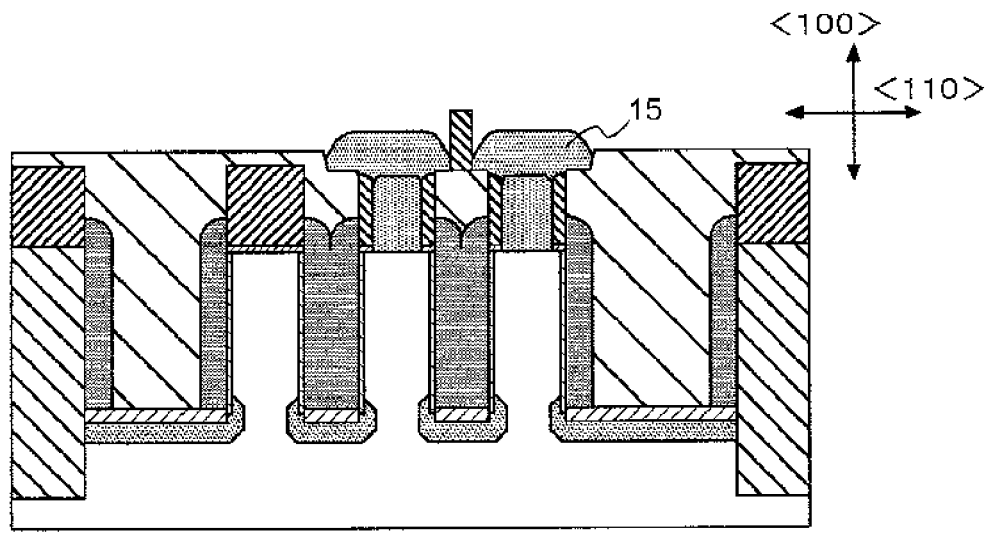
Figure 21:
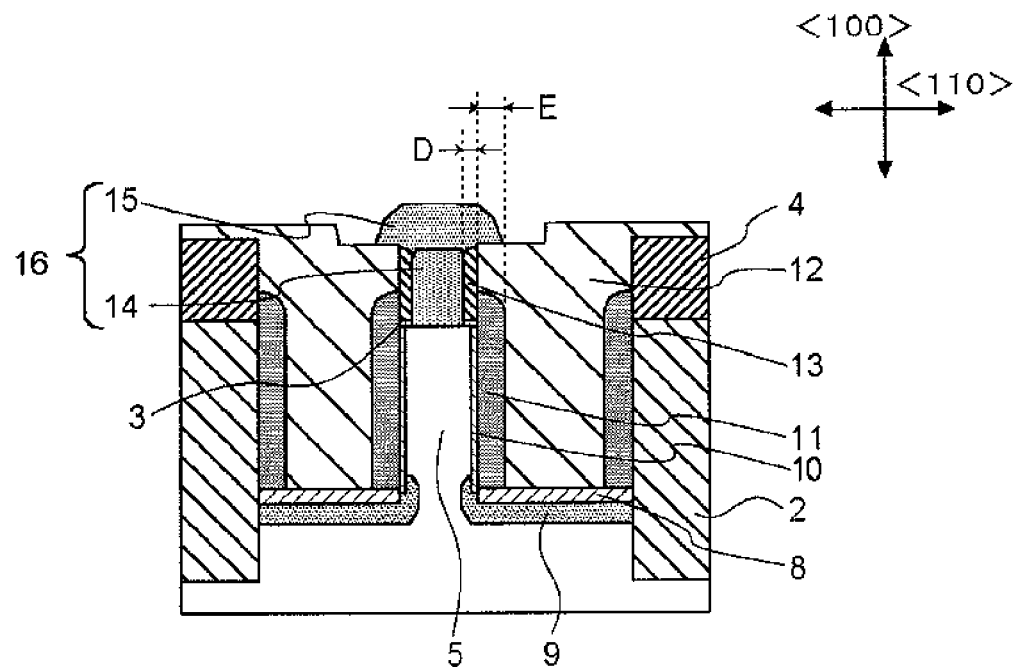
FIG. 21 is a schematic sectional view illustrating a method of manufacturing a semiconductor device according to an embodiment of the present invention, and corresponds to a sectional view of FIG. 2 taken along line Y-Y' explaining the process of FIG. 20.

Next, isotropic selective epitaxial growth is further performed as illustrated in FIG. 20. When upper diffusion layer separating nitride film 17 interposed, second portion 15 grows until it becomes contact with upper diffusion layer separating nitride film 17. The other side, opposite to the side contacting upper diffusion layer separating nitride film 17, grows to the wall surface of opening 12A formed in first interlayer insulating film 12. Meanwhile, in FIG. 21 corresponding to a sectional view of FIG. 2 taken along line Y-Y', absent upper diffusion layer separating nitride film 17, second portion 15 is apart from the wall surface of opening 12A. The growth amount in this direction is so designed that the total amount of growth of {110} plane in <110> direction is less than the sum of thickness D of side wall nitride film 13 and thickness E of gate electrode 11.

Afterwards, second interlayer oxide film 18 is further formed by depositing oxide film on the entire surface, as illustrated in FIG. 1. After the surface of second interlayer oxide film 18 is planarized by, for example, CMP, upper diffusion layer contact 19, gate contact 20, and lower diffusion layer contact 21 are formed, and wiring layer 22 is further formed on second interlayer oxide film 18.

Channel electrode feed silicon pillar 6 is elective. If the gate electrode of the side of STI 2 is connected to the gate electrode of channel silicon pillar 5 in a way that channel silicon pillar 5 is closer to STI 2, gate contact 20 may be formed on STI 2.

Another Embodiment of the Invention

Figure 22A:
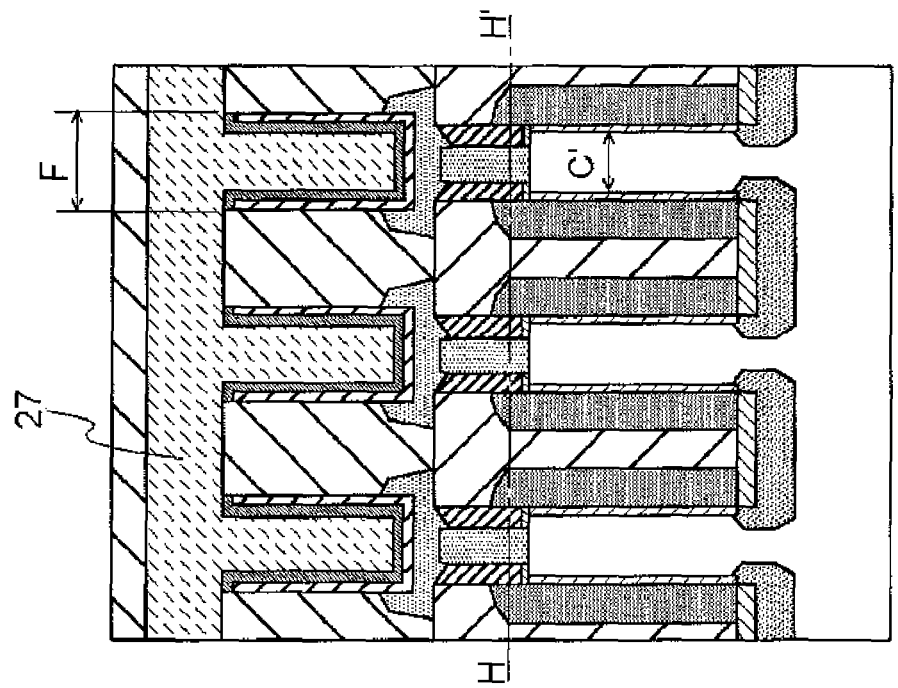
FIGS. 22A and 22B are schematic sectional views showing an example in which the present invention is applied to memory cells of DRAM.
Figure 22B:
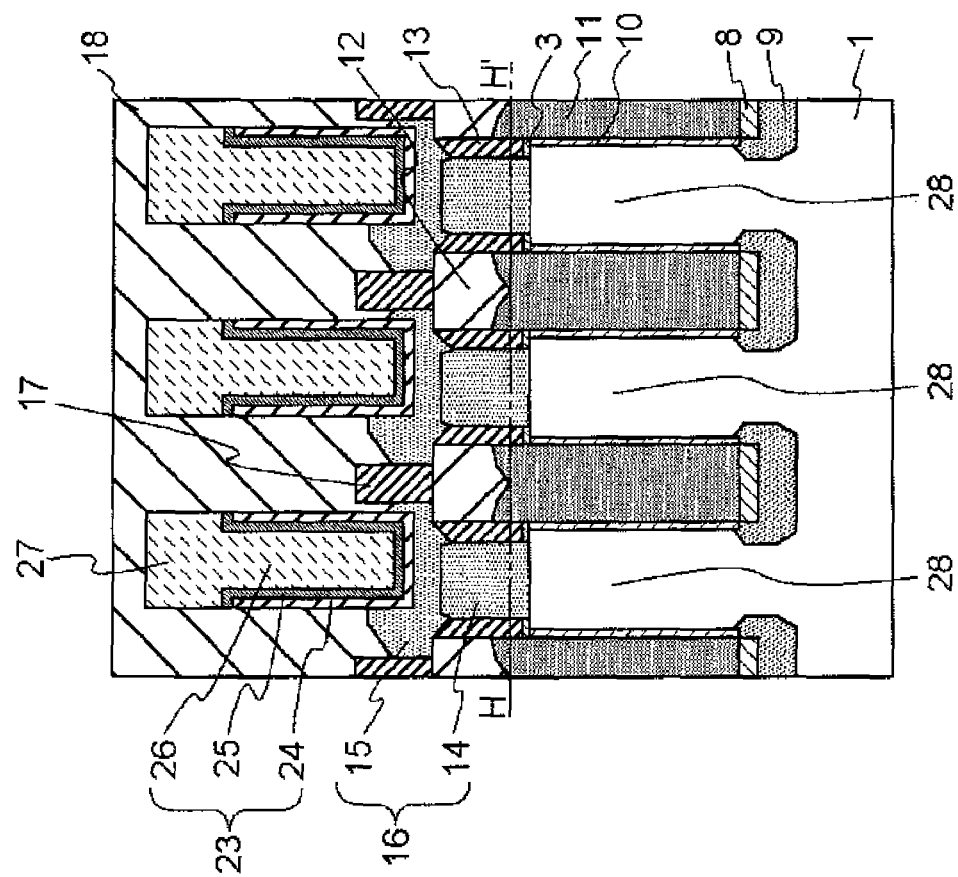

FIG. 22 shows an example where the present invention is applied to memory cells of DRAM. FIG. 23 is an overhead view of FIG. 22. FIG. 23A is a plane view of the structure of FIG. 22 penetrating first and second interlayer insulating films 12 and 18, when viewed from the top. FIG. 23B is a sectional plane view of FIG. 22 taken along dotted line H-H'. FIG. 22A illustrates the word line parallel direction of the memory cells, and corresponds to a sectional view of FIG. 23 taken along line X-X'. FIG. 22B illustrates the bit line parallel direction of the memory cells, and corresponds to a sectional view of FIG. 23 taken along line Y-Y'. Moreover, the minute layout of 4F2 memory cells with selectively 3×3 array is illustrated in FIG. 23.

Capacitors 23 are arranged on upper diffusion layer 16. As illustrated in FIG. 22, capacitor 23 includes lower electrode 24 having a cylindrical shape and connected to upper diffusion layer 16, upper electrode 26 having a columnar shape and connected to bit line 27, and insulating film 25 provided between lower and upper electrodes 24 and 26. Bit lines 27 extend in the direction crossing the word lines along which gates 11 are connected. Bit lines 27 also connect a plurality of capacitors 23 orderly in rows. Upper diffusion layer separating nitride film 17 is arranged in the bit line parallel direction, in order to separate pillar upper diffusion layers 16, which are arranged at a narrower distance in the word line parallel direction.

With structure explained above, when a word line becomes high level, a memory cell transistor arranged in the corresponding line turns on, and bit lines 27 are electrically connected to lower diffusion layer 9, which is a common node. Accordingly, capacitors 23 may read and write through bit lines 27.

In this exemplary embodiment, the silicon pillars have a rectangular shape, viewed from the top, and first portions 14 of upper diffusion layers 16 also have a narrower width in the bit line parallel direction along which the silicon pillars have a narrower width. In this structure, if second portion 15 is grown only as far as it is precisely in contact with upper diffusion separating nitride film 17, the width of second portion 15 in the transverse direction of FIG. 23B becomes narrower. Because it is preferable to make the diameter of a capacitor larger in order to increase the capacity of the capacitor, diameter F of the capacitors could be larger than length C' of the pillars in the bit line parallel direction. If the width of the second portions is narrow in the bit line parallel direction, gate short circuit cannot sufficiently be prevented by pillar upper diffusion layer 16. In contrast, gate short circuit can be sufficiently prohibited in this exemplary embodiment even though diameter F of the capacitors becomes larger by enlarging the width of pillar upper diffusion layers 16 in the bit line parallel direction along which pillar upper diffusion layers 16 are at a wider distance, and upper diffusion separating nitride films 17 are arranged to separate pillar upper diffusion layers 16 in the word line parallel direction along which pillar upper diffusion layers 16 are at a narrower distance.

Figure 24B:
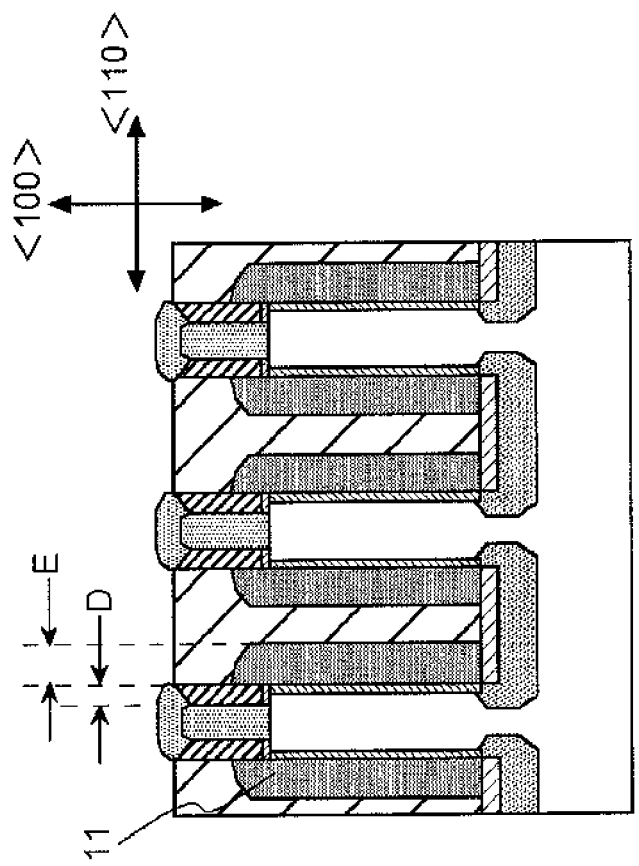
FIGS. 24A and 24B are schematic sectional views illustrating a method of manufacturing the memory cells shown in FIG. 22.
Figure 24A:
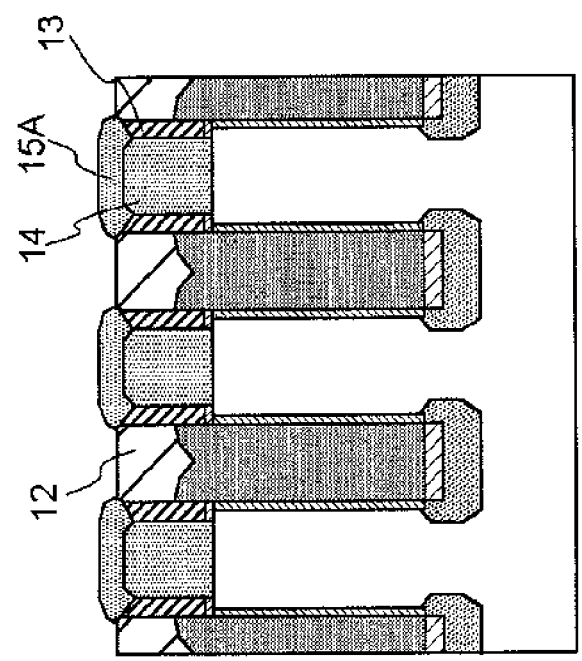
Figure 25B:
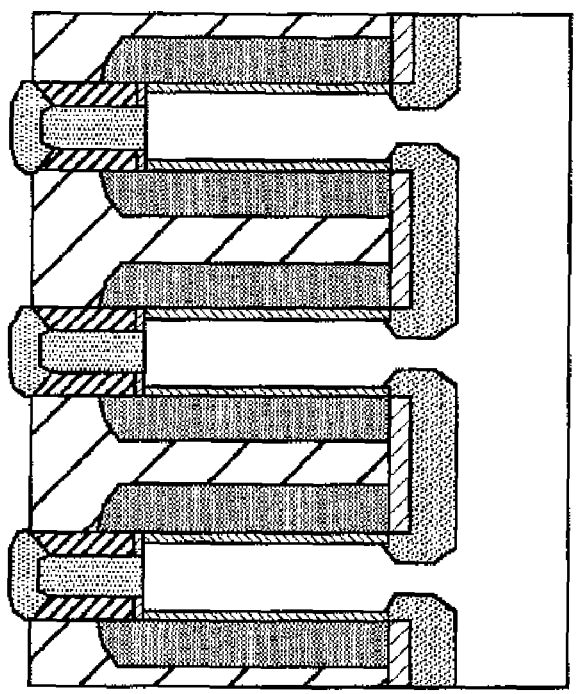
FIGS. 25A and 25B are schematic sectional views illustrating a method of manufacturing the memory cells shown in FIG. 22.
Figure 25A:
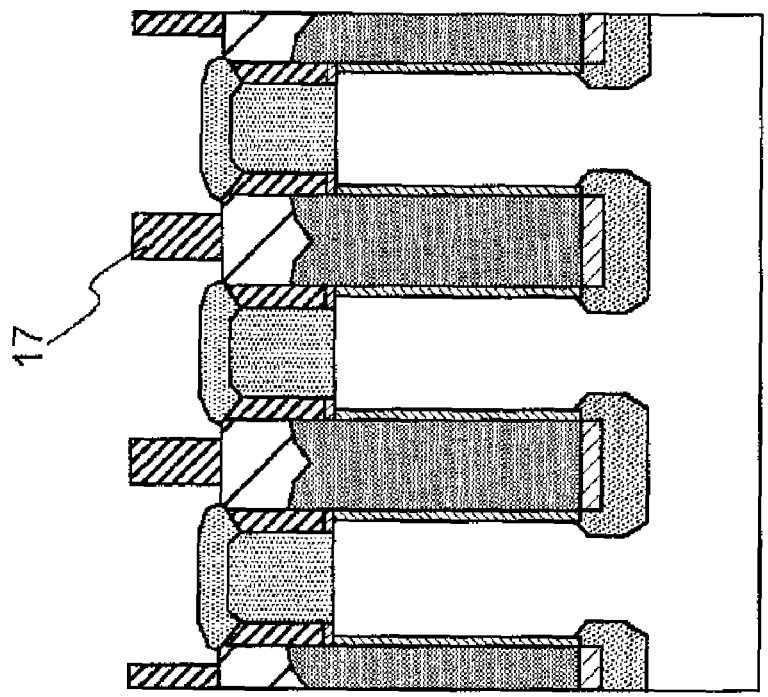
Figure 26B:
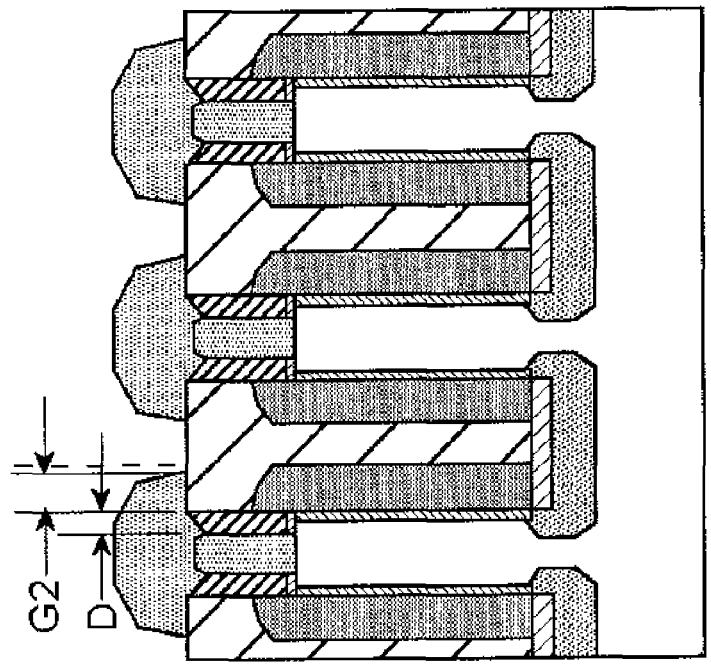
FIGS. 26A and 26B are schematic sectional views illustrating a method of manufacturing the memory cells shown in FIG. 22.
Figure 26A:
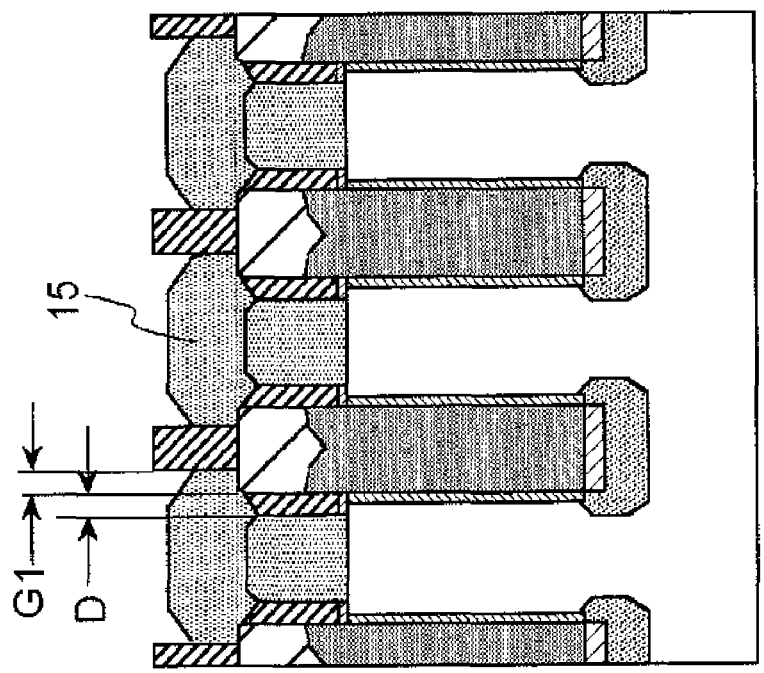

The manufacturing process is described with FIGS. 24 to 26. FIG. 24 shows the structure right after isotropic selective epitaxial growth. The growth amount of isotropic selective epitaxial layer 15A is designed so that the growth amount of $\{110\}$ plane in <110> direction is the same as thickness D of side wall nitride film 13.

Consequently, upper diffusion separating nitride film 17 is formed as illustrated in FIG. 25. It is formed by plasma nitride film growth and patterning. This upper diffusion separating nitride film 17 is to prevent short circuit between adjacent patterns of isotropic epitaxial growth. The upper diffusion separating nitride film is not formed in FIG. 25B because the distance between neighboring memory cell channel pillars is wide.

After that, isotropic selective epitaxial growth is further performed as illustrated in FIG. 26. The growth amount of isotropic selective epitaxial layer 15 is designed so that the total growth amount of $\{110\}$ plane in <110> direction is equal or less than the sum of thickness D of side wall nitride film 13 and thickness E of gate electrode 11. When comparing the growth amounts (growth lengths) in the word line parallel direction and in the bit line parallel direction, growth amount G1 in the word line parallel direction reaches to the side of upper diffusion separating nitride film 17, and growth amount G2 in the bit line parallel direction is more than G1. Therefore, the connection of capacitors having a larger diameter is possible while preventing gate short circuit. As illustrated in this example, the present invention is particularly beneficial to the application of a vertical transistor to a memory cell transistor in which word lines are made by connecting gate electrodes between adjacent transistors.

In the embodiments herein, the first and second portions of the upper diffusion layer, which is to be the second diffusion layer, are formed by epitaxial growth on the silicon pillars. However, the method of manufacturing the first and second portions is not limited to such a method, and the first portion of the upper diffusion layer may be formed by ion-implantation to the semiconductor pillars, and then the second portion may be formed by isotropic selective epitaxial growth on the first portion. In this case, the second portion may be grown in the transverse direction while opening 12A illustrated in FIG. 14 is formed more deeply with a lower height of side wall 13 above the silicon pillars, or while opening 12A is dug down to the upper portion of the silicon pillars with no side wall formed. In this structure, of course, the upper end of the gate electrode is formed lower, thereby separating the gate electrode from the second portion.

The present invention further includes the following exemplary embodiments:

A. A method of manufacturing a semiconductor device including vertical transistors comprising:

forming a plurality of body portions made of pillar-shaped semiconductors by digging down a semiconductor substrate, wherein a mask layer, which is formed on the semiconductor substrate, is used as a mask, forming a gate electrode provided on the side surface of each of said body portions via a gate insulating film, forming a first diffusion layer connected to the bottom of each of said body portions, and forming a second diffusion layer connected to the top of each of said body portions, wherein said second diffusion layer forming comprises: after forming a first interlayer insulating film at least filling up said mask layer by forming said gate electrode and said first diffusion layer, forming a first portion in an opening formed after said mask layer is removed, and forming a second portion, above said first portion, extending from said opening onto said first interlayer insulating film, and wherein after a second insulating film, which is different from said first interlayer insulating film, is formed on said first interlayer insulating film between adjacent vertical transistors, said second portion is grown by epitaxial growth as far as said second portion becomes at least in contact with the side surface of said second insulating film.

B. The method according to A, wherein the gate electrodes of adjacent vertical transistors are in contact each other, and wherein said second insulating film is arranged above the contact portion of the gate electrodes.

C. The method according to A, wherein said second portion of said second electrode has an end portion not being in contact with said second insulating film, within a region projected in the substrate vertical direction with a thickness not more than a thickness of said gate electrode in the substrate plane direction from the upper surface end portion of said body portion.

D. The method according to A, wherein said second portion of said second diffusion layer is formed by the isotropic selective epitaxial growth.

E. The method according to D, wherein said body portion is formed by engraving a semiconductor substrate having surface $\{110\}$ as a main surface.

F. The method according to D, wherein said first portion of said second diffusion layer is formed by the anisotropic selective epitaxial growth.

G. The method according to A, wherein the upper end of said gate electrode in the substrate vertical direction is formed over the top surface of said body portion, and below the upper end of said side wall insulating film, wherein, after forming said first diffusion layer, said first interlayer insulating film is accumulated on the entire surface, wherein a side wall is formed on the side wall surface of an opening formed after said mask layer is removed, and the top surface of said body portion is exposed, wherein said first portion of said second diffusion layer is formed, no more than the height of said side wall, by anisotropic selective epitaxial growth on the top surface of said exposed body portion, and wherein, then, said second portion of said second diffusion layer is grown by isotropic selective epitaxial growth, and extended onto said first interlayer insulating film over the upper end of said side wall.

H. The method according to G, wherein said first interlayer insulating film is formed higher than the top surface of said mask layer, wherein said mask layer is removed after an opening is formed to expose a portion of the side surface and the top surface of said mask layer on at least two adjacent body portions in said first interlayer insulating film, wherein the upper end of said side wall is lower than the bottom surface of said opening, and wherein said second insulating film is formed between said at least two adjacent body portions in said opening.

I. The method according to H, wherein said second insulating film is formed after said second portion of said second diffusion layer is grown, no more than the thickness of said side wall, by a first isotropic selective epitaxial growth, and wherein, then, said second portion of said second diffusion layer is formed, by a second isotropic selective epitaxial growth, to reach said second insulating film.

J. The method according to A, further comprising:

forming a second interlayer insulating film on said second diffusion layer, forming an opening exposing said second portion of said second diffusion layer in said second interlayer insulating film, and forming a contact in said opening.

K. The method according to A, further comprising:

forming a second interlayer insulating film on said second diffusion layer, forming an opening exposing said second portion of said second diffusion layer in said second interlayer insulating film, and forming a capacitor in said opening.

What is claimed is:

1. A semiconductor device including a plurality of vertical transistors, which comprises, on a substrate, a body portion of a pillar-shaped semiconductor;

a gate electrode provided on the side surface of said body portion via a gate insulating film;

a first diffusion layer connected to the bottom of said body portion; and a second diffusion layer connected to the top of said body portion, wherein said second diffusion layer includes a first portion formed within a region projected in the substrate vertical direction of the top surface of said body portion; and a second portion formed on the first portion and extended onto an interlayer insulating film, which is arranged between vertical transistors, outwards the region projected in the substrate vertical direction of the top surface of said body portion, wherein a second insulating film, which is different from the interlayer insulating film, is arranged on said interlayer insulating film between two adjacent vertical transistors, and wherein said second portion is an epitaxial growth layer formed by an isotropic selective epitaxial growth and is in contact with the side surface of said second insulating film.

2. The semiconductor device according to claim 1, wherein said gate electrodes of adjacent vertical transistors are in contact with each other, and wherein said second insulating film is arranged above the contact portion of said gate electrodes.

3. The semiconductor device according to claim 1, wherein said body portion is formed by engraving a semiconductor substrate having {110} plane as a principal surface.

4. The semiconductor device according to claim 1, wherein said first portion of said second diffusion layer is formed by the anisotropic selective epitaxial growth.

5. The semiconductor device according to claim 1, wherein said first portion of said second diffusion layer is bounded laterally by a side wall insulating film, and wherein the upper end of said gate electrode in the substrate vertical direction is arranged above the top surface of said body portion, and below the upper end of said side wall insulating film.

6. The semiconductor device according to claim 1, further comprising a contact connected to said second portion of said second diffusion layer.

7. The semiconductor device according to claim 1, further comprising a capacitor connected to said second portion of said second diffusion layer.

8. A semiconductor device comprising a first transistor, the first transistor comprising:

a body region having a pillar-shaped region which includes at least one side surface, a top surface and a bottom surface opposite to the top surface;

a gate insulating film provided on the side surface of the body region;

a gate electrode provided on the gate insulating film such that the gate insulating film intervenes between the side surface of the body region and the gate electrode;

one of the source and drain regions connected to the bottom surface of the body region; and the other of the source and drain regions including a first portion having a pillar-shaped electrode which includes at least one side surface, a top surface and a bottom surface opposite to the top surface of the first portion, the bottom surface of the first portion being connected to the top surface of the body region, the other of the source and drain regions further including a second portion having a bottom surface connected to the top surface of the first portion, and the bottom surface of the second portion being larger in size than the top surface of the first portion.

9. The semiconductor device according to claim 8, wherein the second portion of the other of the source and drain regions is formed by the isotropic selective epitaxial growth.

10. The semiconductor device according to claim 8, further comprising a capacitor which has an upper electrode and a lower electrode which has a cylindrical shape, the lower electrode being provided on the second portion of the other of the source and drain regions, and a sectional area of the lower electrode being smaller than the bottom surface of the second portion of the other of the source and drain regions.

11. The semiconductor device according to claim 8, further comprising a second transistor adjacent to the first transistor, the second transistor being the same in construction as the first transistor, wherein the gate electrodes of the first and second transistors are connected to each other.

12. The semiconductor device according to claim 11, further comprising an interlayer insulating film between the others of the source and drain regions of the first and second transistors so that the others of the source and drain regions of the first and second transistors are electrically separated from each other.

13. The semiconductor device according to claim 12, wherein the interlayer insulating film includes a first insulating portion between the first portions of the others of the source and drain regions of the first and second transistors and the first insulating portion includes an oxide film.

14. The semiconductor device according to claim 13, wherein the interlayer insulating film further includes a second insulating portion between the second portions of the others of the source and drain regions of the first and second transistors and the second insulating portion includes a nitride film.

15. The semiconductor device according to claim 11, wherein the first and second transistors are arranged adjacently to each other in a first direction, the semiconductor device further comprising a third transistor arranged adjacently to the first transistor in a second direction different from the first direction, the third transistor being the same construction as the first transistor, the gate electrodes of the first and third transistors are electrically independent of each other.

16. The semiconductor device according to claim 15, further comprising a fourth transistor arranged adjacently to the third transistor in the first direction, the fourth transistor being the same construction as the first transistor, wherein gate electrodes of the third and fourth transistor are connected to each other.

\* \* \* \* \*